US011911868B2

(12) United States Patent
Mitsuya et al.

(10) Patent No.: US 11,911,868 B2
(45) Date of Patent: Feb. 27, 2024

(54) SUBSTRATE PROCESSING APPARATUS, SUBSTRATE PROCESSING METHOD, AND STORAGE MEDIUM THAT STORES PROGRAM TO CAUSE COMPUTER IN SUBSTRATE PROCESSING APPARATUS TO EXECUTE SUBSTRATE PROCESSING METHOD

(71) Applicant: EBARA CORPORATION, Tokyo (JP)

(72) Inventors: Takashi Mitsuya, Tokyo (JP); Asagi Matsugu, Tokyo (JP); Ayumu Saito, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 296 days.

(21) Appl. No.: 17/355,525

(22) Filed: Jun. 23, 2021

(65) Prior Publication Data

US 2021/0402548 A1    Dec. 30, 2021

(30) Foreign Application Priority Data

Jun. 29, 2020 (JP) ................................. 2020-111535

(51) Int. Cl.
  *B24B 37/005*   (2012.01)
  *H01L 21/66*    (2006.01)
  *H01L 21/306*   (2006.01)

(52) U.S. Cl.
  CPC ...... *B24B 37/005* (2013.01); *H01L 21/30625* (2013.01); *H01L 22/26* (2013.01)

(58) Field of Classification Search
  CPC ....... B24B 37/005; B24B 37/27; B24B 37/30; B24B 37/32; B24B 37/34; B24B 37/345;
  (Continued)

(56) References Cited

U.S. PATENT DOCUMENTS 6,328,629 B1    12/2001  Togawa et al.
6,634,924 B1    10/2003  Ono et al.
               (Continued)

FOREIGN PATENT DOCUMENTS

EP    1240977 A2    9/2002
EP    3812094 A1    4/2021
              (Continued)

OTHER PUBLICATIONS

European Patent Application No. 21181846.3; Extended Search Report; dated Nov. 25, 2021; 9 pages.

*Primary Examiner* — Don M Anderson
*Assistant Examiner* — Caleb Andrew Holizna
(74) *Attorney, Agent, or Firm* — BakerHostetler

(57) ABSTRACT

Accuracy of detection of a fly out of a substrate from a polishing head is improved. A substrate processing apparatus includes a polishing table 350 to which a polishing pad 352 for polishing the substrate is attachable, a polishing head 302 for holding and pressing the substrate against the polishing pad 352, a retainer member disposed surrounding the polishing head 302, a retainer member pressurization chamber disposed adjacent to the retainer member, an arm 360 for holding and turning the polishing head 302, and a slip out detector 910 for detecting a fly out of the substrate from the polishing head 302 based on a turning torque of the arm 360 or based on a flow rate of a fluid supplied to the retainer member pressurization chamber.

15 Claims, 7 Drawing Sheets

(58) Field of Classification Search
CPC ........... B24B 7/228; B24B 7/005; B24B 7/04; B24B 7/042; B24B 7/10; H01L 21/30625; H01L 22/26
USPC ............................................................ 451/5
See application file for complete search history.

(56) References Cited

U.S. PATENT DOCUMENTS

| | | |
|---|---|---|
| 9,240,042 B2 | 1/2016 | Doughty et al. |
| 2005/0130562 A1* | 6/2005 | Nabeya .................. B24B 49/12 451/6 |
| 2010/0035516 A1* | 2/2010 | Takahashi ............. B24B 37/013 451/5 |
| 2012/0129433 A1* | 5/2012 | Makiuchi ................ B24B 5/045 451/5 |
| 2015/0214091 A1* | 7/2015 | Rodnick ................ B25J 9/1656 700/228 |
| 2015/0266159 A1 | 9/2015 | Shiokawa et al. |
| 2017/0173756 A1* | 6/2017 | Yamaki ................ B24B 37/005 |

FOREIGN PATENT DOCUMENTS

| | | |
|---|---|---|
| JP | H10-230450 A | 9/1998 |
| JP | 2001-096455 A | 4/2001 |

\* cited by examiner

SUBSTRATE PROCESSING APPARATUS, SUBSTRATE PROCESSING METHOD, AND STORAGE MEDIUM THAT STORES PROGRAM TO CAUSE COMPUTER IN SUBSTRATE PROCESSING APPARATUS TO EXECUTE SUBSTRATE PROCESSING METHOD

TECHNICAL FIELD

This application relates to a substrate processing apparatus, a substrate processing method, and a storage medium that stores a program to cause a computer in the substrate processing apparatus to execute the substrate processing method. This application claims priority from Japanese Patent Application No. 2020-111535 filed on Jun. 29, 2020. The entire disclosure including the descriptions, the claims, the drawings, and the abstracts in Japanese Patent Application No. 2020-111535 is herein incorporated by reference.

BACKGROUND ART

There is a Chemical Mechanical Polishing (CMP) device as a type of a substrate processing apparatus used in a semiconductor processing step. The CMP device can be roughly divided into a "face-up type (a method where a surface to be polished of a substrate faces upward)" and a "face-down type (a method where the surface to be polished of the substrate faces downward)" depending on a direction that the surface to be polished of the substrate faces.

The face-down type chemical mechanical polishing device includes a polishing head that holds a substrate and a polishing table to which a polishing pad is attached, and is configured to polish the substrate by pressing the substrate against the polishing pad while rotating the polishing head and the polishing table. Here, in the polishing of the substrate, the substrate may possibly come off from the polishing head to slip out the polishing head.

In contrast to this, for example, PTL 1 discloses that, by measuring a rotation drive current of a polishing head or a polishing table, slipout of a substrate is detected. PTL 2 discloses that, by measuring a pressure or a flow rate of a fluid supplied to a back surface of a substrate, slipout of the substrate is detected.

CITATION LIST

Patent Literature

PTL 1: Japanese Unexamined Patent Application Publication No. 2001-96455
PTL 2: Japanese Unexamined Patent Application Publication No. 10-230450

SUMMARY OF INVENTION

Technical Problem

In the technique disclosed in PTL 1, when the substrate flies out from the polishing head, a friction resistance between the substrate and the polishing pad changes, and the change in friction resistance is proportionate to the rotation drive current value of the polishing head or the polishing table. As such, the slipout of the substrate is detected based on the change in current value. Additionally, in the technique disclosed in PTL 2, when the substrate flies out from the polishing head, the pressure/flow rate of the fluid supplied to the back surface of the substrate changes. As such, the slipout of the substrate is detected based on the change in pressure/flow rate of the fluid.

However, the techniques described in PTLs 1 and 2 have room for improving accuracy of detection of the slipout of the substrate. That is, the polishing head and the polishing table are members that polish the substrate sandwiched therebetween via the polishing pad while pressing the substrate. Accordingly, the polishing head and the polishing table directly receive a vibration caused by the polishing of the substrate, and the vibration is reflected to the rotation drive current value of the polishing head and the polishing table or the pressure/flow rate of the fluid supplied to the back surface of the substrate as noise. As a result, the techniques described in PTLs 1 and 2 possibly erroneously detect the change in rotation drive current value caused by noise or the change in pressure/flow rate of the fluid supplied to the back surface of the substrate caused by noise as the slipout of the substrate.

Therefore, one object of this application is to improve accuracy of detection of a slipout of a substrate from a polishing head.

Solution to Problem

According to one embodiment, a substrate processing apparatus is disclosed. The substrate processing apparatus includes a polishing table, a polishing head, a retainer member, a retainer member pressurization chamber, an arm, and a slip out detector. A polishing pad for polishing a substrate is attachable to the polishing table. The polishing head is for holding and pressing the substrate against the polishing pad. The retainer member is disposed surrounding the polishing head. The retainer member pressurization chamber is disposed adjacent to the retainer member. The arm is for holding and turning the polishing head. The slip out detector is for detecting a slipout of the substrate from the polishing head based on a turning torque of the arm or based on a flow rate of a fluid supplied to the retainer member pressurization chamber.

DESCRIPTION OF EMBODIMENTS

Figure 1:
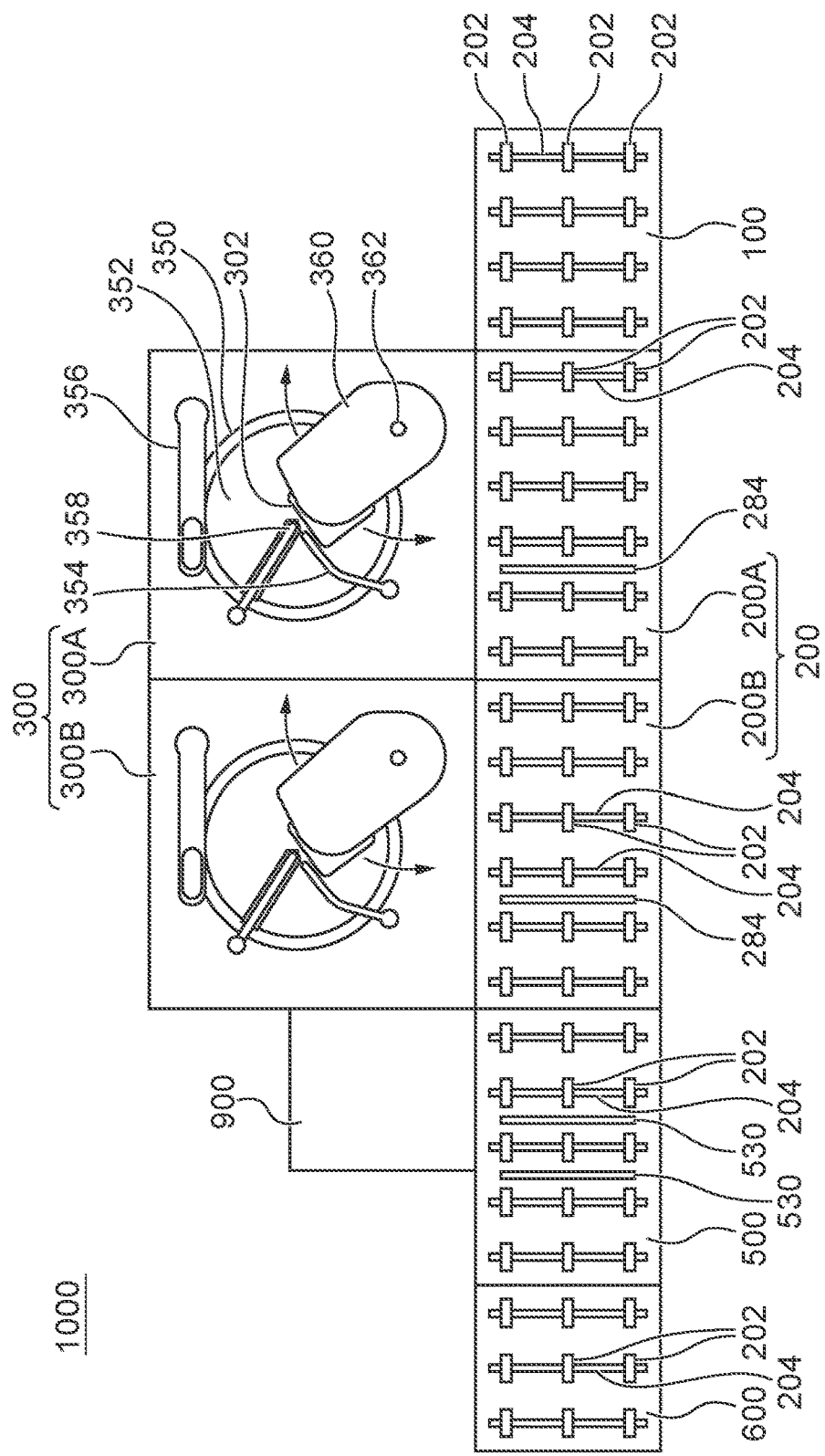
FIG. 1 is a plan view illustrating an overall configuration of a substrate processing apparatus according to one embodiment.

The following will describe embodiments of a substrate processing apparatus, a substrate processing method, and a storage medium that stores a program to cause a computer in the substrate processing apparatus to execute the substrate processing method according to the present invention with reference to the attached drawings. In the attached drawings, the same or similar reference numerals are attached to the same or similar components, and overlapping description regarding the same or similar components may be omitted in the description of the respective embodiments. Features illustrated in the respective embodiments are applicable to other embodiments in so far as they are consistent with one another.

FIG. 1 is a plan view illustrating an overall configuration of a substrate processing apparatus 1000 according to one embodiment. The substrate processing apparatus 1000 illustrated in FIG. 1 includes a loading unit 100, a conveyance unit 200, a polishing unit 300, a drying unit 500, and an unloading unit 600. In the illustrated embodiment, the conveyance unit 200 includes two conveyance units 200A, 200B, and the polishing unit 300 includes two polishing units 300A, 300B. In one embodiment, these units can be each independently formed. Independently forming these units ensures facilitating to form the substrate processing apparatus 1000 in a different configuration by appropriately combining the number of respective units. The substrate processing apparatus 1000 includes a control device 900, and each component of the substrate processing apparatus 1000 is controlled by the control device 900. In one embodiment, the control device 900 can be configured of a general computer that includes, for example, an input/output device, an arithmetic device, and a storage device.

<Loading Unit>

The loading unit 100 is a unit for introducing a substrate WF before processes, such as polishing and cleaning, are performed into the substrate processing apparatus 1000. In one embodiment, the loading unit 100 is configured to be compliant to a mechanical equipment interface standard (IPC-SMEMA-9851) of Surface Mount Equipment Manufacturers Association (SMEMA).

In the illustrated embodiment, a conveyance mechanism of the loading unit 100 includes a plurality of conveyance rollers 202 and a plurality of roller shafts 204 to which the conveyance rollers 202 are mounted. In this embodiment illustrated in FIG. 1, the three conveyance rollers 202 are mounted to each roller shaft 204. The substrate WF is disposed on the conveyance rollers 202, and the substrate WF is conveyed by rotation of the conveyance rollers 202.

<Conveyance Unit>

The substrate processing apparatus 1000 illustrated in FIG. 1 includes the two conveyance units 200A, 200B. Since the two conveyance units 200A, 200B can have the same configuration, they are collectively described as the conveyance unit 200 in the following description.

The illustrated conveyance unit 200 includes the plurality of conveyance rollers 202 to convey the substrate WF. By rotating the conveyance rollers 202, the substrate WF on the conveyance rollers 202 can be conveyed in a predetermined direction. The conveyance rollers 202 are driven by a motor (not illustrated). The substrate WF is conveyed to a substrate transfer position by the conveyance rollers 202.

In one embodiment, the conveyance unit 200 includes cleaning nozzles 284. The cleaning nozzle 284 is connected to a supply source (not illustrated) of a cleaning liquid. The cleaning nozzle 284 is configured to supply the cleaning liquid to the substrate WF conveyed by the conveyance rollers 202.

<Drying Unit>

The drying unit 500 is a device to dry the substrate WF. In the substrate processing apparatus 1000 illustrated in FIG. 1, the drying unit 500 dries the substrate WF cleaned by a cleaning unit of the conveyance unit 200 after the polishing by the polishing unit 300. As illustrated in FIG. 1, the drying unit 500 is disposed in the downstream of the conveyance unit 200.

The drying unit 500 includes nozzles 530 to inject a gas to the substrate WF conveyed on the conveyance rollers 202. The gas can be, for example, a compressed air or nitrogen. By blowing off water droplets on the conveyed substrate WF by the drying unit 500, the substrate WF can be dried.

<Unloading Unit>

The unloading unit 600 is a unit to carry out the substrate WF after the processes, such as the polishing and the cleaning, are performed outside the substrate processing apparatus 1000. In the substrate processing apparatus 1000 illustrated in FIG. 1, the unloading unit 600 receives the substrate after the drying by the drying unit 500. As illustrated in FIG. 1, the unloading unit 600 is disposed in the downstream of the drying unit 500. In one embodiment, the unloading unit 600 is configured to be compliant to the mechanical equipment interface standard (IPC-SMEMA-9851) of Surface Mount Equipment Manufacturers Association (SMEMA).

<Polishing Unit>

Figure 2:
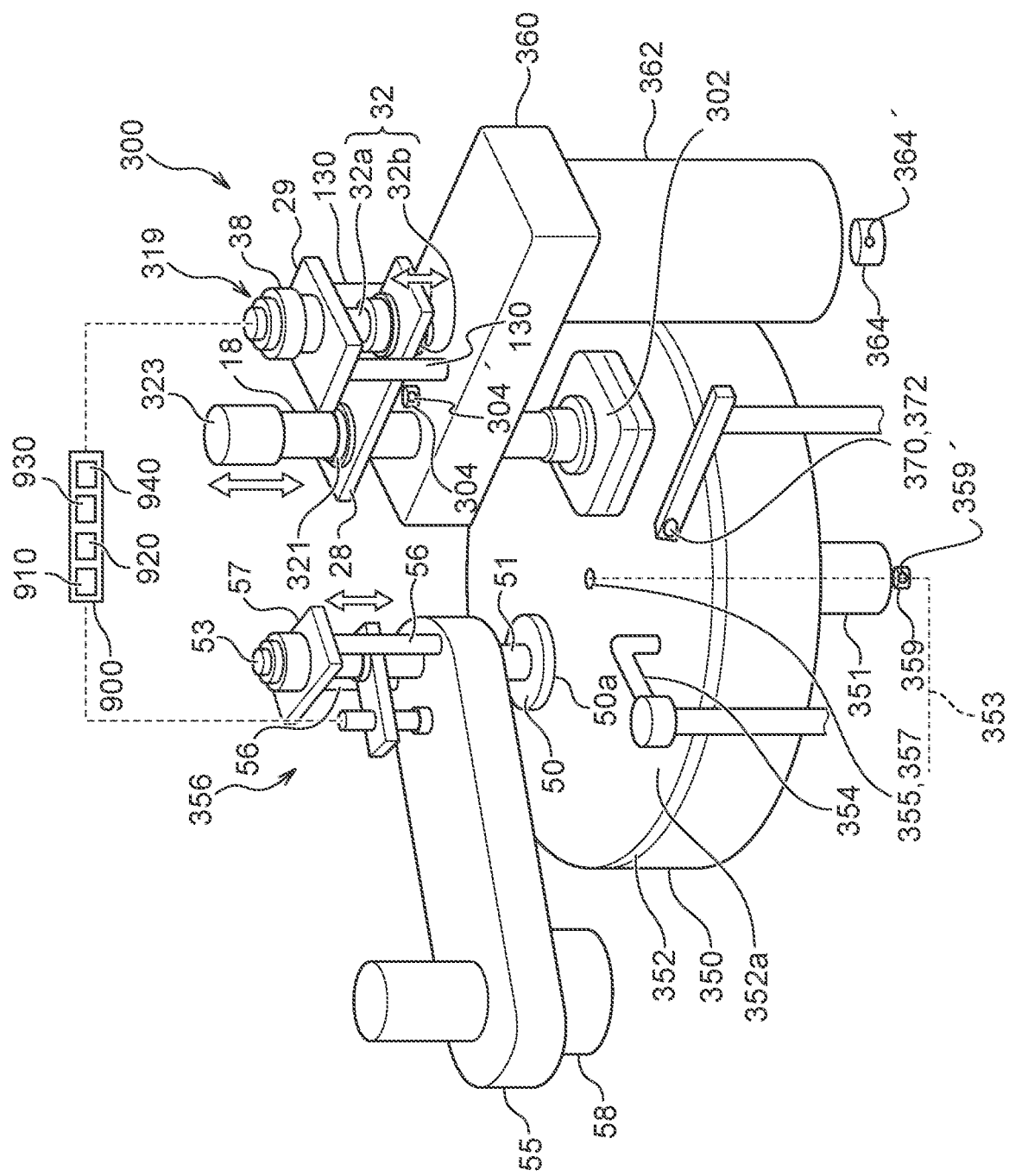
FIG. 2 is a perspective view schematically illustrating a configuration of a polishing unit according to one embodiment.

FIG. 2 is a perspective view schematically illustrating a configuration of the polishing unit 300 according to one embodiment. The substrate processing apparatus 1000 illustrated in FIG. 1 includes the two polishing units 300A, 300B. Since the two polishing units 300A, 300B can have the same configuration, they are collectively described as the polishing unit 300 in the following description.

As illustrated in FIG. 2, the polishing unit 300 includes a polishing table 350 and a polishing head 302. The polishing head 302 holds the substrate as an object to be polished to press the substrate against a polishing surface on the polishing table 350. The polishing table 350 is coupled to a polishing table rotation motor 359 disposed via a table shaft 351 therebelow, and rotatable about the table shaft 351. The polishing table rotation motor 359 includes a polishing table ammeter 359' configured to measure a drive current of the polishing table rotation motor 359 as a polishing table torque detector to detect a physical quantity correlated to a rotating torque of the polishing table 350. A polishing pad 352 is attached to a top surface of the polishing table 350, and a surface 352a of the polishing pad 352 constitutes the polishing surface to polish the substrate.

A polishing liquid supply nozzle 354 is installed above the polishing table 350, and the polishing liquid supply nozzle 354 supplies the polishing liquid on the polishing pad 352 on the polishing table 350. As illustrated in FIG. 2, a passage 353 is disposed through the polishing table 350 and the table shaft 351 to supply the polishing liquid. The passage 353 is communicated with an opening portion 355 in the surface of the polishing table 350. The polishing pad 352 is provided with a through-hole 357 at a position corresponding to the opening portion 355 of the polishing table 350, and the polishing liquid passing through the passage 353 is supplied to the surface of the polishing pad 352 from the opening portion 355 of the polishing table 350 and the through-hole 357 of the polishing pad 352.

While not illustrated in FIG. 2, in one embodiment, the polishing unit 300 includes an atomizer 358 (see FIG. 1) to inject a liquid or a mixture fluid of a liquid and a gas to the polishing pad 352. The liquid injected from the atomizer 358 is, for example, pure water, and the gas is, for example, nitrogen gas.

The polishing head 302 is connected to a polishing head shaft 18, and the polishing head shaft 18 is configured to be moved up and down with respect to an arm 360 by an up-and-down motion mechanism 319. The polishing head 302 is configured to be entirely moved up and down with respect to the arm 360 by the up-and-down motion of the polishing head shaft 18 and positioned. The polishing head shaft 18 is configured to be rotated by the driving of a polishing head rotation motor 304. The polishing head rotation motor 304 includes a polishing head ammeter 304' configured to measure a drive current of the polishing head rotation motor 304 as a polishing head torque detector to detect a physical quantity correlated to a rotating torque of the polishing head 302. The polishing head 302 is configured to be rotated about the polishing head shaft 18 by the rotation of the polishing head shaft 18. The polishing head 302 is configured to hold a quadrilateral substrate in its lower surface. A rotary joint 323 is mounted to an upper end of the polishing head shaft 18.

The arm 360 is configured to be turnable about a spindle 362. The arm 360 is coupled to an arm rotation motor 364, which is disposed below the arm 360 via the spindle 362, and is rotatable around the spindle 362. The arm rotation motor 364 includes an arm ammeter 364' configured to measure a drive current of the arm rotation motor 364 as an arm torque detector to detect a physical quantity correlated to a turning torque (rotating torque) of the arm 360. In a case where the arm rotation motor 364 is a servo motor, the arm rotation motor 364 serves as the arm torque detector. The polishing head 302 is movable between the substrate transfer position of the conveyance unit 200 described above and a position above the polishing table 350 by the turn of the arm 360. By moving down the polishing head shaft 18, the polishing head 302 can be moved down to press the substrate against the surface (polishing surface) 352a of the polishing pad 352. At this time, the polishing head 302 and the polishing table 350 are each rotated, and the polishing liquid is supplied on the polishing pad 352 from the polishing liquid supply nozzle 354 disposed above the polishing table 350 and/or from the opening portion 355 provided in the polishing table 350. Thus, the substrate WF is pressed to the polishing surface 352a of the polishing pad 352, thereby allowing the polishing of the surface of the substrate. The arm 360 may be secured or swung such that the polishing head 302 passes through the center of the polishing pad 352 (covers the through-hole 357 of the polishing pad 352) during the polishing of the substrate WF.

The up-and-down motion mechanism 319 that moves the polishing head shaft 18 and the polishing head 302 up and down includes a bridge 28, a ball screw 32, a support table 29, and a servo motor 38. The bridge 28 rotatably supports the polishing head shaft 18 via a bearing 321. The ball screw 32 is mounted to the bridge 28. The support table 29 is supported by a support pillar 130. The servo motor 38 is disposed on the support table 29. The support table 29 that supports the servo motor 38 is secured to the arm 360 via the support pillar 130.

The ball screw 32 includes a screw shaft 32a coupled to the servo motor 38, and a nut 32b with which the screw shaft 32a is screwed. The polishing head shaft 18 is configured to move up and down integrally with the bridge 28. Accordingly, when the servo motor 38 is driven, the bridge 28 moves up and down via the ball screw 32, thereby moving the polishing head shaft 18 and the polishing head 302 up and down. The polishing unit 300 can calculate a height position of the polishing head 302 based on the data received from the servo motor 38. For example, the calculated height position of the polishing head 302 is used in a process of detecting a height of the surface of the polishing pad 352 to constantly maintain a distance between the polishing head 302 and the polishing pad 352, regardless of a change in thickness of the polishing pad 352. The process is performed by counting the number of rotation by an encoder of the servo motor 38 while lowering the polishing head 302, and calculating a lowering distance (height position) of the polishing head 302 from the count value by the encoder of the servo motor 38 when the lower surface of the polishing head 302 contacts the surface of the polishing pad 352. The devices in the polishing unit including the servo motor 38 are each configured to be controlled by the control device 900.

The polishing unit 300 according to one embodiment includes a dressing unit 356 that dresses the polishing surface 352a of the polishing pad 352. As illustrated in FIG. 2, the dressing unit 356 includes a dresser 50, a dresser shaft 51, an air cylinder 53, and an arm 55. The dresser 50 is brought into sliding contact with the polishing surface 352a. The dresser 50 is coupled to the dresser shaft 51. The air cylinder 53 drives the dresser shaft 51 up and down. The arm 55 rotatably supports the dresser shaft 51. A dressing member 50a is held onto the lower portion of the dresser 50, and needle-shaped diamond particles are electrodeposited to the lower surface of the dressing member 50a. The air cylinder 53 is disposed on a support table 57 supported by support pillars 56, and the support pillars 56 are secured to the arm 55.

The arm 55 is configured to be driven by a motor (not illustrated) to turn about a spindle 58. The dresser shaft 51 is disposed to be opposed to the polishing pad 352 and rotated by the driving of a motor (not illustrated), and the dresser 50 is rotated about the dresser shaft 51 by the rotation of the dresser shaft 51. The air cylinder 53 moves the dresser 50 up and down via the dresser shaft 51, and presses the dresser 50 to the polishing surface 352a of the polishing pad 352 with a predetermined pressing force.

The dressing of the polishing surface 352a of the polishing pad 352 is performed as follows. The dresser 50 is pressed to the polishing surface 352a by the air cylinder 53, and the pure water is simultaneously supplied to the polishing surface 352a from a pure water supply nozzle (not illustrated). In this state, the dresser 50 rotates about the dresser shaft 51 to bring the lower surface (diamond particles) of the dressing member 50a into sliding contact with the polishing surface 352a. Thus, the polishing pad 352 is scraped off by the dresser 50, and the polishing surface 352a is dressed.

Figure 3:
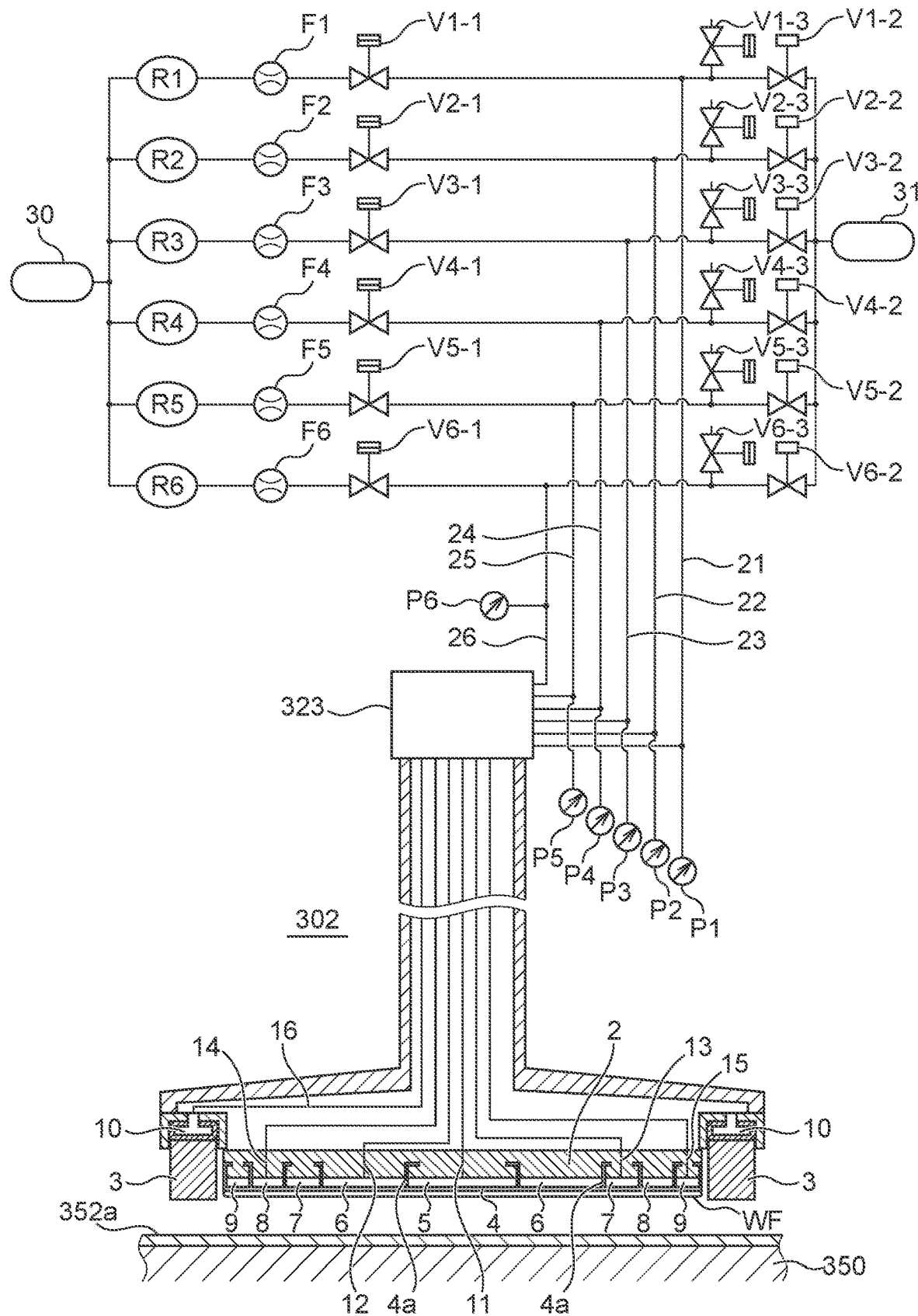
FIG. 3 is a schematic cross-sectional view of a polishing head that holds the substrate as an object to be polished and presses the substrate against a polishing surface on the polishing pad according to one embodiment.

Next, the polishing head 302 in the polishing unit 300 according to one embodiment will be described. FIG. 3 is a schematic cross-sectional view of the polishing head 302 that holds the substrate as an object to be polished and presses the substrate against the polishing surface on the polishing pad according to one embodiment. In FIG. 3, only main configuration members configuring the polishing head 302 are schematically illustrated.

As illustrated in FIG. 3, the polishing head 302 includes a polishing head main body 2, which presses the substrate WF to the polishing surface 352a, and a retainer member 3, which is disposed surrounding the peripheral area of the polishing head 302 and directly presses the polishing surface 352a. The polishing head main body 2 is formed of a substantially quadrangle tabular member. The retainer member 3 is mounted to the outer peripheral portion of the polishing head main body 2. The polishing head main body 2 has a lower surface on which an elastic film (membrane) 4 that contacts a back surface of the substrate is mounted. In one embodiment, the elastic film (membrane) 4 is made of a rubber material having excellent strength and durability, such as an ethylene propylene rubber (EPDM), a polyurethane rubber, and a silicon rubber.

The elastic film (membrane) 4 has a plurality of concentric partition walls 4a. These partition walls 4a form a circular center chamber 5, a quadrangle frame-shaped ripple chamber 6 surrounding the center chamber 5, a quadrangle frame-shaped middle chamber 7 surrounding the ripple chamber 6, a quadrangle frame-shaped outer chamber 8 surrounding the middle chamber 7, and a quadrangle frame-shaped edge chamber 9 surrounding the outer chamber 8 between an upper surface of the elastic film 4 and the lower surface of the polishing head main body 2. That is, the center chamber 5 is formed on a center portion of the polishing head main body 2, and the ripple chamber 6, the middle chamber 7, the outer chamber 8, and the edge chamber 9 are concentrically formed sequentially from the center to an outer peripheral direction. As illustrated in FIG. 3, the polishing head main body 2 internally has respective flow passage 11 communicated with the center chamber 5, flow passage 12 communicated with the ripple chamber 6, flow passage 13 communicated with the middle chamber 7, flow passage 14 communicated with the outer chamber 8, and flow passage 15 communicated with the edge chamber 9. The flow passage 11, flow passage 12, flow passage 13, flow passage 14, and flow passage 15 are coupled to flow passages 21, 22, 23, 24, 25 via the rotary joint 323, respectively. The flow passages 21, 22, 23, 24, 25 are coupled to a fluid supply source 30 via valves V1-1, V2-1, V3-1, V4-1, V5-1 and pressure regulators R1, R2, R3, R4, and R5, respectively. The flow passages 21, 22, 23, 24, 25 are connected to a vacuum source 31 via valves V1-2, V2-2, V3-2, V4-2, and V5-2 and can communicate with the atmosphere via valves V1-3, V2-3, V3-3, V4-3, and V5-3, respectively.

Additionally, a retainer member pressurization chamber 10 made of an elastic film is formed on the retainer member 3. The retainer member pressurization chamber 10 is connected to a flow passage 26 via a flow passage 16, which is formed inside the polishing head main body 2, and the rotary joint 323. That flow passage 26 is connected to the fluid supply source 30 via a valve V6-1 and a pressure regulator R6. The flow passage 26 is connected to the vacuum source 31 via a valve V6-2 and can communicate with the atmosphere via a valve V6-3. The respective pressure regulators R1, R2, R3, R4, R5, R6 have a pressure regulation function that regulates a pressure of a pressurized fluid supplied from the fluid supply source 30 to the center chamber 5, the ripple chamber 6, the middle chamber 7, the outer chamber 8, the edge chamber 9, and the retainer member pressurization chamber 10. The structure allows regulating a pressing force of pressing the substrate WF against the polishing pad 352 for each region of the substrate WF and a pressing force of pressing the polishing pad 352 by the retainer member 3. The pressure regulators R1, R2, R3, R4, R5, R6 and the respective valves V1-1 to V1-3, V2-1 to V2-3, V3-1 to V3-3, V4-1 to V4-3, V5-1 to V5-3, V6-1 to V6-3 are connected to the control device 900 (see FIG. 1) for control of their actuations. In the flow passages 21, 22, 23, 24, 25, 26, pressure sensors P1, P2, P3, P4, P5, P6 and flow rate sensors F1, F2, F3, F4, F5, F6 are installed, respectively. While the retainer member pressurization chamber 10 is integrally formed on the rectangular retainer member 3 in this embodiment, this should not be construed in a limiting sense, and the retainer member pressurization chambers 10 may be separately formed on the respective four sides of the retainer member 3. In this case, the valve V6-1, the pressure regulator R6, the pressure sensor P6, and the flow rate sensor F6 may be disposed on the respective four retainer member pressurization chambers 10.

<Slip Out Detection>

As illustrated in FIG. 2, the polishing unit 300 includes a slip out detector 910. The slip out detector 910 can be achieved as a function block of the control device 900. The slip out detector 910 is configured to detect a slipout of the substrate WF from the polishing head 302 based on the turning torque of the arm 360. For example, the slip out detector 910 detects the slipout of the substrate WF from the polishing head 302 based on the change in physical quantity correlated to the turning torque of the arm 360. Specifically, to the slip out detector 910, a drive current value measured by the arm ammeter 364' is input. When an amount of change per unit time of the drive current value measured by the arm ammeter 364' exceeds a preset threshold value, the slip out detector 910 detects the slipout of the substrate WF from the polishing head 302. In this embodiment, an example in which the turning torque of the arm 360 is detected based on the drive current value measured by the arm ammeter 364' is described, but the embodiment is not limited to this. In the case where the arm rotation motor 364 is a servo motor, the slip out detector 910 allows detecting the turning torque of the arm 360 based on the data received from the arm rotation motor 364. In this case, the arm ammeter 364 may be omitted.

Figure 4:
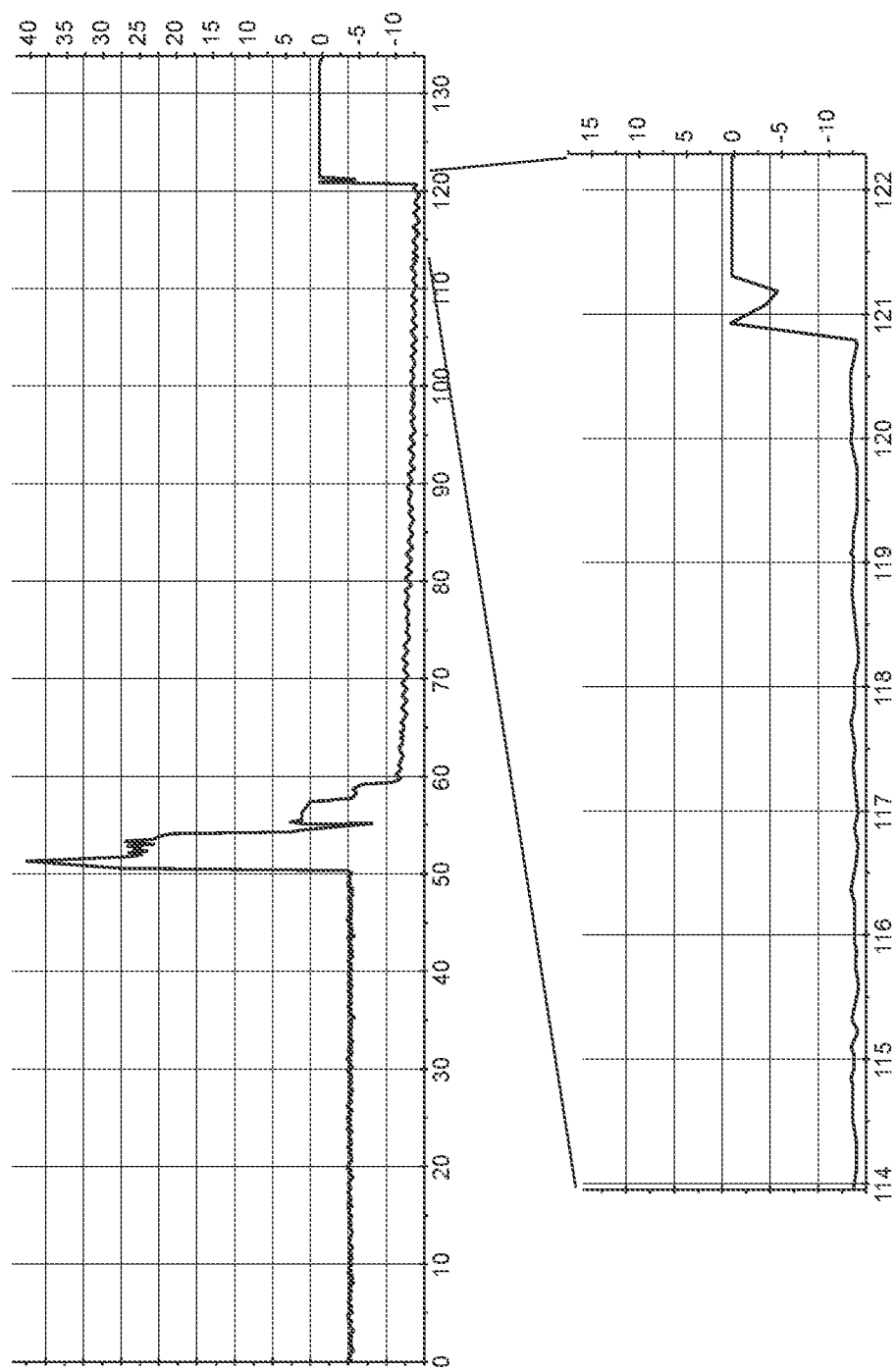
FIG. 4 is a drawing illustrating a relationship between a drive current of an arm and a slip out of the substrate.

FIG. 4 is a drawing illustrating a relationship between the drive current of the arm 360 and the slip out of the substrate WF. In FIG. 4, the vertical axis indicates the drive current (A) of the arm 360 and the horizontal axis indicates a time (second). The upper drawing in FIG. 4 indicates the drive current of the arm 360 in a process from when the polishing process of the substrate WF starts until the slip out occurs, and the lower drawing in FIG. 4 indicates the enlarged part where the slip out of the substrate WF occurs.

When the arm 360 is turned from the outside of the polishing table 350 above the polishing table 350, as illustrated around 50 seconds in FIG. 4, the turning torque of the arm 360 occurs, and the drive current of the arm 360 significantly changes. Afterwards, when the substrate WF is pressed against the polishing pad 352 at a predetermined position on the polishing table 350 to start polishing, the arm 360 continues holding the polishing head 302 at the predetermined position on the polishing table 350 against a friction force between the substrate WF and the polishing pad 352. In view of this, as illustrated around from 60 seconds to around 120 seconds in FIG. 4, in association with continuation of occurrence of the predetermined turning torque in the arm 360, a predetermined drive current continues flowing in the arm 360. Then, when the slip out of the substrate WF occurs, in accordance with a loss of the friction force between the substrate WF and the polishing pad 352, the turning torque of the arm 360 rapidly decreases, and as illustrated around 121 seconds in FIG. 4, the drive current of the arm 360 significantly changes. Since the amount of change per unit time (for example, every 0.1 seconds) of the drive current value of the arm 360 exceeds the preset threshold value at the timing, the slip out detector 910 can detect the slipout of the substrate WF from the polishing head 302.

According to this embodiment, accuracy of detection of the slip out of the substrate WF from the polishing head 302 can be improved. That is, as in the related art, to detect the slip out of the substrate WF based on the change in rotating torque of the polishing head or the polishing table, since the noise caused by the vibration during polishing is directly reflected to the rotating torque of the polishing head or the polishing table, erroneous detection due to the noise possibly occurs. In contrast to this, in this embodiment, since the slip out of the substrate WF is detected based on the change in turning torque of the arm 360, the vibration during polishing is not directly reflected to the turning torque of the arm 360, and as a result, the erroneous detection caused by the vibration noise can be suppressed.

Here, as in this embodiment, to detect the slip out of the substrate WF based on the change in turning torque of the arm 360, the slip out of the substrate WF is possibly erroneously detected caused by the swing (turn) of the arm 360. That is, there may be a case where the polishing unit 300 polishes the substrate WF while swinging (reciprocating) the arm 360 in a predetermined range on the polishing table 350. In this case, since the arm 360 decelerates and accelerates in a turn-around region of the swing of the arm 360, this appears as the change in turning torque of the arm 360, possibly resulting in erroneous detection that the slip out of the substrate WF has occurred.

In this respect, as illustrated in FIG. 2, the polishing unit 300 includes a speed detector 920 to detect a turning speed of the arm 360. The speed detector 920 can be achieved as a function block of the control device 900. The speed detector 920 is configured to receive information on the rotation direction and the rotational speed of the arm 360 transmitted from the arm rotation motor 364 and detect the turning speed of the arm 360 based on the change in position of the arm 360 per unit time. The slip out detector 910 is configured to stop the detection of the slipout of the substrate WF from the polishing head 302 based on the speed detected by the speed detector 920. Specifically, in a case where the speed detected by the speed detector 920 is less than a preset threshold value, it is considered that the arm 360 is in the turn-around region of the swing, and therefore the slip out detector 910 is configured to stop the detection of the slipout of the substrate WF from the polishing head 302.

According to this embodiment, the detection of the slipout of the substrate WF can be stopped from when the arm 360 is decelerated in the turn-around region of the swing of the arm 360 until the arm 360 is accelerated again and reaches the predetermined speed. Thus, the erroneous detection in the turn-around region of the swing of the arm 360 can be suppressed.

Instead of or together with the slip out detection of the substrate WF based on the change in turning torque of the arm 360, the slip out detector 910 can detect the slip out of the substrate WF based on the flow rate of the fluid supplied to the retainer member pressurization chamber 10. That is, the slip out detector 910 is configured to detect the slipout of the substrate WF from the polishing head 302 based on the change in flow rate detected by the flow rate sensor F6. Specifically, when the amount of change per unit time of the flow rate of the fluid detected by the flow rate sensor F6 exceeds a preset threshold value, the slip out detector 910 is configured to detect the slipout of the substrate WF from the polishing head 302.

Figure 5:
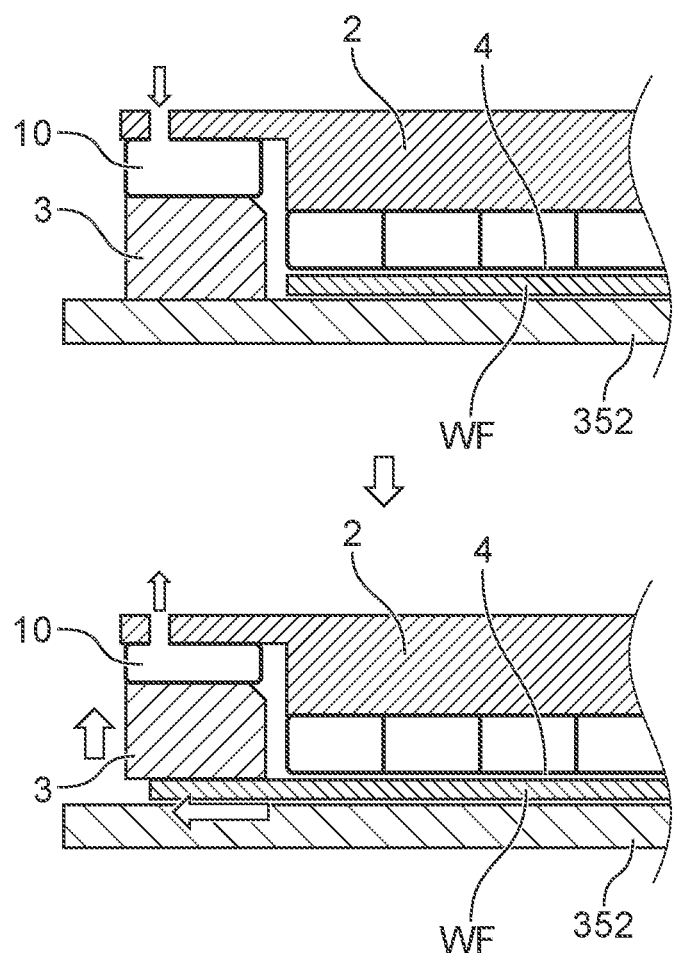
FIG. 5 is a drawing schematically illustrating a state of a retainer member pressurization chamber during the slip out of the substrate.

FIG. 5 is a drawing schematically illustrating the state of the retainer member pressurization chamber 10 during the slip out of the substrate WF. The upper drawing in FIG. 5 illustrates the state in which the slip out of the substrate WF does not occur, and the lower drawing in FIG. 5 illustrates a state in which the slip out of the substrate WF occurs. As illustrated in the upper drawing in FIG. 5, in the case where the slip out of the substrate WF does not occur in the state where the fluid is supplied to the retainer member pressurization chamber 10 and the retainer member 3 presses the polishing pad 352, the flow rate of the fluid supplied to the retainer member pressurization chamber 10 is less likely to change. Meanwhile, when the slip out of the substrate WF occurs, the change in flow rate of the fluid supplied to the retainer member pressurization chamber 10 increases, for example, flowing out of the fluid from the retainer member pressurization chamber 10 by the substrate WF pressing up the retainer member 3.

Figure 6:
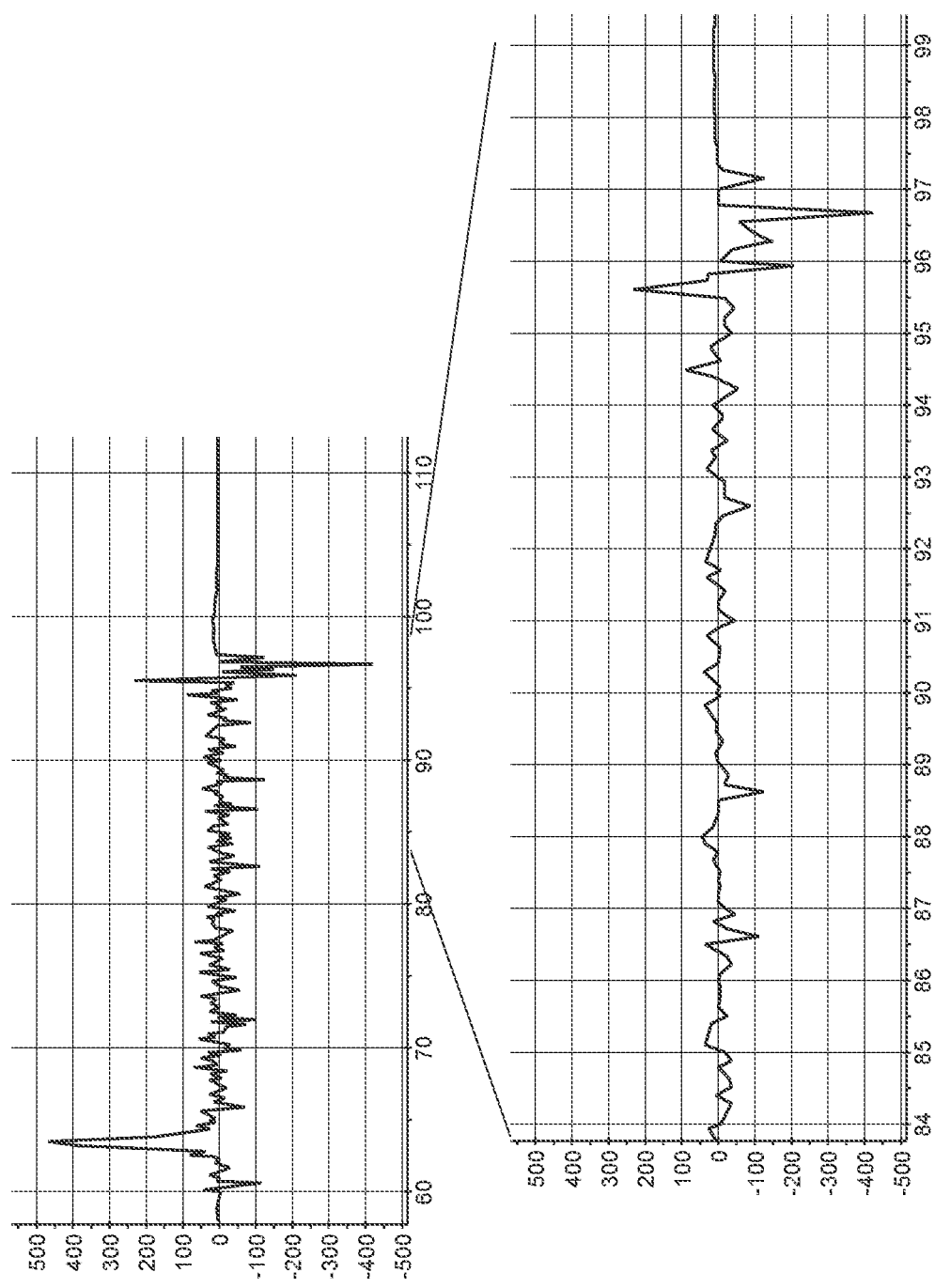
FIG. 6 is a drawing illustrating a relationship between a flow rate of a fluid supplied to the retainer member pressurization chamber and the slip out of the substrate.

FIG. 6 is a drawing illustrating a relationship between the flow rate of the fluid supplied to the retainer member pressurization chamber 10 and the slip out of the substrate WF. In FIG. 6, the vertical axis indicates the flow rate (mL) of the fluid supplied to the retainer member pressurization chamber 10 and the horizontal axis indicates the time (second). The upper drawing in FIG. 6 indicates the flow rate of the fluid supplied to the retainer member pressurization chamber 10 in the process in which the slip out occurs from the start of the polishing process of the substrate WF, and the lower drawing in FIG. 6 indicates the enlarged part where the slip out of the substrate WF occurs.

To start the polishing process of the substrate WF, when the fluid is supplied to the retainer member pressurization chamber 10 and the retainer member 3 is pressed against the polishing pad 352, as illustrated around the elapse of 60 seconds in FIG. 6, the flow rate of the fluid supplied to the retainer member pressurization chamber 10 significantly changes. Afterwards, while the polishing process of the substrate WF is performed, the polishing pad 352 continues pressing the retainer member 3 and the position of the retainer member 3 does not change so much, and therefore the flow rate of the fluid supplied to the retainer member pressurization chamber 10 hardly changes. Afterwards, when the slip out of the substrate WF occurs, the substrate WF contacts the retainer member 3 and presses up the retainer member 3 and presses back the retainer member 3 by the supply of the fluid from the fluid supply source 30, and this causes flow-in/flow-out of the fluid to the retainer member pressurization chamber 10. In view of this, as illustrated around 96 seconds in FIG. 6, the flow rate of the fluid supplied to the retainer member pressurization chamber 10 significantly changes. The amount of change per unit time (for example, every 0.1 seconds) of the flow rate of the fluid supplied to the retainer member pressurization chamber 10 exceeds the preset threshold value at the timing, and thus the slip out detector 910 can detect the slipout of the substrate WF from the polishing head 302.

According to this embodiment, accuracy of detection of slip out of the substrate WF from the polishing head 302 can be improved. That is, as in the related art, to detect the slipout of the substrate based on the change in pressure/flow rate of the fluid supplied to the back surface of the substrate, since the noise caused by the vibration during polishing is directly reflected to the pressure/flow rate of the fluid, erroneous detection due to the noise possibly occurs. In contrast to this, in this embodiment, since the slip out of the substrate WF is detected based on the change in flow rate of the fluid supplied to the retainer member pressurization chamber 10, the vibration during polishing is not directly reflected to the flow rate of the fluid supplied to the retainer member pressurization chamber 10, and as a result, the erroneous detection caused by the vibration noise can be suppressed.

Note that, in this embodiment, the slip out of the substrate WF is detected based on the change in flow rate of the fluid supplied to the retainer member pressurization chamber 10, but this should not be construed in a limiting sense. The slip out of the substrate WF can be detected based on the change in pressure of the fluid supplied to the retainer member pressurization chamber 10. In this case, the slip out detector 910 is configured to detect the slipout of the substrate WF from the polishing head 302 when the amount of change per unit time of the pressure of the fluid detected by the pressure sensor P6 exceeds the preset threshold value. In this embodiment, the case where the retainer member pressurization chamber 10 is integrally formed in the rectangular frame shape has been described, but the embodiment is not limited to this. The retainer member pressurization chambers 10 may be separately disposed to the respective four sides of the retainer member 3 and the flow rate sensors F6 may be disposed to the respective retainer member pressurization chambers 10. In this case, the slip out detector 910 can detect the slip out of the substrate WF based on the change in flow rate of the fluid detected by any of the four flow rate sensors F6.

In addition to the detection of the slip out of the substrate WF based on the change in turning torque of the arm 360 and/or the change in flow rate of the fluid supplied to the retainer member pressurization chamber 10, the slip out detector 910 can combine another slip out detection. For example, the polishing unit 300 includes the polishing table ammeter 359' as a table torque detector to detect a physical quantity correlated to a rotating torque of the polishing table 350. The slip out detector can detect the slipout of the substrate WF from the polishing head 302 based on the change in drive current detected by the polishing table ammeter 359'.

Additionally, the polishing unit 300 includes the polishing head ammeter 304' as a polishing head torque detector to detect a physical quantity correlated to the rotating torque of the polishing head 302. The slip out detector 910 can detect the slipout of the substrate WF from the polishing head 302 based on the change in drive current detected by the polishing head ammeter 304'.

Further, as illustrated in FIG. 2, the polishing unit 300 includes a light emitting member 370 to emit light to the polishing pad 352 and a light receiving member 372 to receive light reflected by the polishing pad 352. The slip out detector 910 can detect the slipout of the substrate WF from the polishing head 302 based on a change in light amount of a reflected light emitted from the light emitting member 370 and received by the light receiving member 372. That is, since the polishing pad 352 and the substrate WF have different reflectivity of light, when the substrate WF goes out of the polishing head 302 and appears in an emission region of the light, the light amount of the reflected light changes. Accordingly, when the change is detected, it is determined that the substrate WF comes off from the polishing head 302. Additionally, the slip out detector 910 can detect the slipout of the substrate WF from the polishing head 302 based on a change in color of the reflected light emitted from the light emitting member 370 and received by the light receiving member 372. That is, the slip out detector 910 emits the light to the polishing pad 352 before the polishing process of the substrate WF is performed, and registers a reference color of the polishing pad based on the light reflected by the polishing pad 352. During the polishing process of the substrate WF, the slip out detector 910 compares the color based on the light reflected by the polishing pad 352 with the reference color. Since the colors of the polishing pad 352 and the substrate WF differ, when the substrate WF comes off from the polishing head 302 and appears in the emission region of the light, the slip out detector 910 detects the color different from the reference color of the polishing pad 352, and therefore the slipout of the substrate WF from the polishing head 302 can be detected.

When the slip out is detected by one or a plurality of the methods described above to detect the slip out of the substrate WF, the slip out detector 910 can determine that the substrate WF slips out and stop the polishing unit 300. Furthermore, monitoring means, such as a CCD camera, that captures an image of the surface of the polishing pad 352 is disposed near the outside of the polishing head 302 above the polishing pad 352, and this allows the slip out detector 910 to detect the slipout of the substrate WF from the polishing head 302.

As illustrated in FIG. 2, the polishing unit 300 includes a setting change detector 930 that detects an issuance of a setting change command to change at least one setting value of a height of the polishing head 302 with respect to the polishing pad 352, pressures of a plurality of substrate pressurization chambers (the center chamber 5, the ripple chamber 6, the middle chamber 7, the outer chamber 8, and the edge chamber 9) formed in the polishing head 302, the pressure of the retainer member pressurization chamber 10, the rotational speed of the polishing table 350, the rotational speed of the polishing head 302, or the turning speed of the arm 360. The setting change detector 930 can be achieved as a function block of the control device 900. For example, the setting change detector 930 can detect the setting change command input by an operator via a Graphical User Interface (GUI) screen disposed in the substrate processing apparatus 1000 or the setting change command by an automatic command issued from a host computer in the substrate processing apparatus 1000. When the setting change detector 930 detects the issuance of the setting change command, the slip out detector 910 is configured to stop the detection of the slipout of the substrate WF from the polishing head 302 for a predetermined period.

That is, when the various setting change commands as described above are issued while the polishing unit 300 polishes the substrate WF, the predetermined period is required until the setting is changed and the state enters the normal polishing state. In a transition period of performing the setting change, the above-described various detected values, which serve as triggers in the slipout detection of the substrate WF, change, and this possibly results in erroneous detection as the slip out of the substrate WF. Therefore, when the various setting change commands as described above are issued, the slip out detector 910 disables the slip out detection for the predetermined period to ensure suppressing the erroneous detection. Note that, the configuration is not limited to the above-described configuration, and the slip out detector 910 can be configured to detect the slip out in a case where the turning (swing) speed of the arm 360 is changed during the polishing of the substrate WF as well. That is, in a case where the speed of the arm 360 is always changed or the arm 360 is moved at a constant speed and goes back at the end portion when the substrate WF is polished while the arm 360 is swung, the slip out detector 910 allows enabling the slip out detection.

<Substrate Processing Method>

Figure 7:
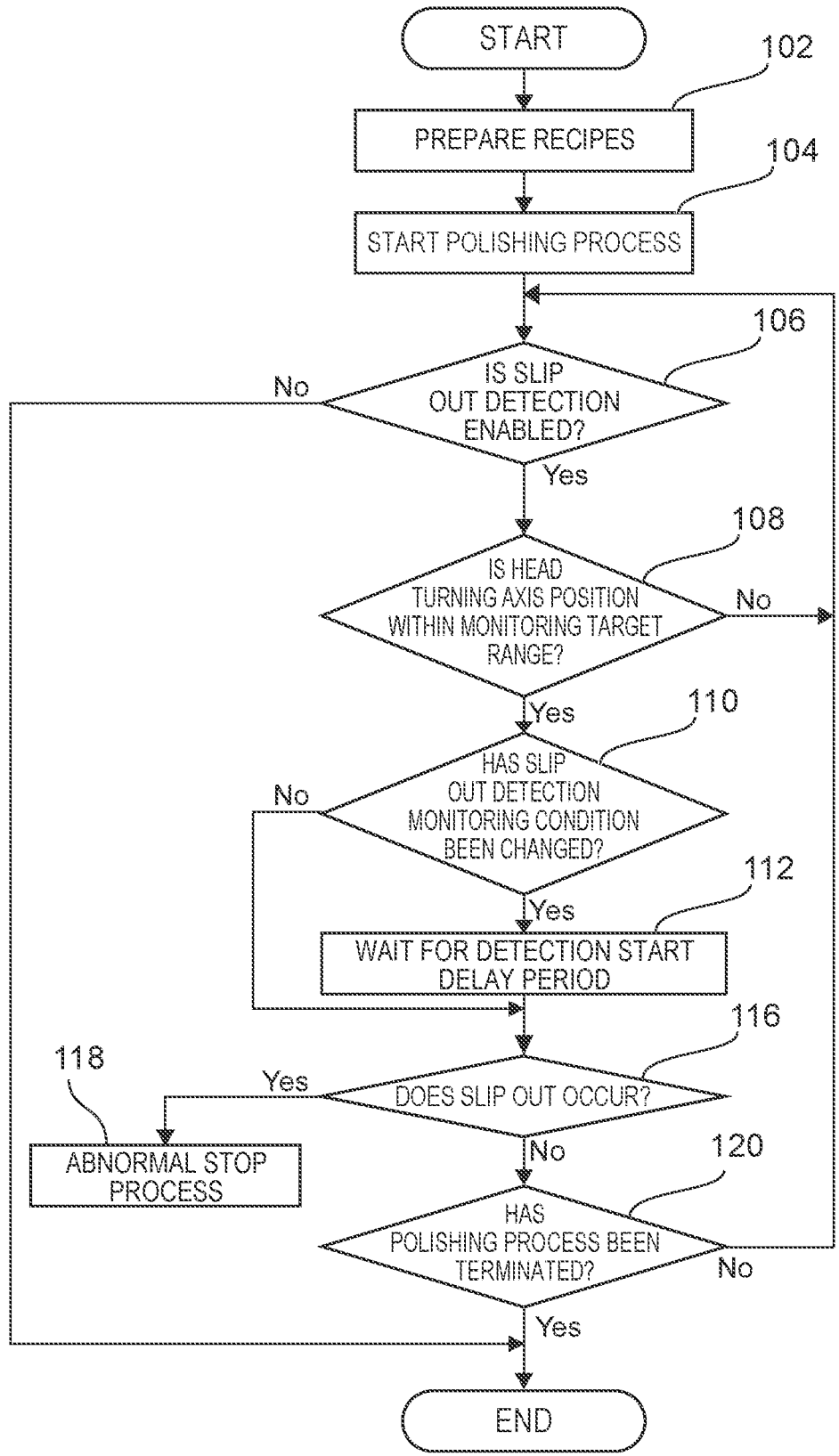
FIG. 7 is a flowchart depicting a substrate processing method of this embodiment.

Next, the substrate processing method of this embodiment will be described. FIG. 7 is a flowchart depicting the substrate processing method of this embodiment. In the substrate processing method, first, the operator prepares various recipes for the substrate process via the GUI screen (Step 102) to start the polishing process of the substrate (Step 104). Specifically, the polishing step holds the substrate WF by the polishing head 302 and presses the polishing pad 352, and performs a relative movement between the substrate WF and the polishing pad 352 to polish the substrate WF. Subsequently, the substrate processing method determines whether the slip out detection function of the substrate WF is enabled (Step 106), and terminates the process when the slip out detection function is not enabled (Step 106: No).

On the other hand, in a case where the slip out detection function is enabled (Step 106: Yes), the slip out detector 910 determines whether the polishing head 302 is within a monitoring target range (Step 108). That is, when the polishing process of the substrate WF starts, the polishing head 302 receives the substrate at the substrate transfer position and conveys the substrate on the polishing table 350 by turning of the arm 360. At this time, whether the slip out occurs is not determined until the polishing head 302 is carried in the predetermined range on the polishing table 350 so as not to cause the erroneous detection of the slip out based on the change in turning torque of the arm 360.

When it is determined that the polishing head 302 in within the monitoring target range (Step 108: Yes), the slip out detector 910 determines whether the monitoring condition for the slip out detection has been changed (Step 110). The slip out detector 910 can perform the determination of Step 110 depending on whether the setting change detector 930 detects the above-described selling change command. When the monitoring condition for the slip out detection has been changed (Step 110: Yes), the slip out detector 910 stands by for a predetermined detection start delay period (Step 112). This allows suppressing the erroneous detection of the slip out caused by setting change.

On the other hand, when the monitoring condition for the slip out detection has not been changed (Step 110: No), or after the slip out detector 910 stands by for the predetermined detection start delay period at Step 112, the slip out detector 910 performs the slip out detection of the substrate WF and determines whether the slip out occurs (Step 116). The slip out detector 910 can detect the slip out of the substrate WF based on the change in turning torque of the arm 360 or based on the change in flow rate of the fluid supplied to the retainer member pressurization chamber 10. In addition to this, the slip out detector 910 may combine slip out detection based on a change in rotating torque of the polishing table 350/the polishing head 302, or slip out detection based on a change in color or light amount of the reflected light received by the light receiving member 372.

When the slip out of the substrate WF is detected (Step 116: Yes), the slip out detector 910 performs an abnormal stop process of the polishing unit 300 (Step 118). On the other hand, when the slip out of the substrate WF is not detected, (Step 116: No), the slip out detector 910 determines whether the polishing process has been terminated (Step 120). When the polishing process is not terminated (Step 120: No), the slip out detector 910 returns the process to Step 108 to repeat the process. On the other hand, when the polishing process has been terminated (Step 120: Yes), the slip out detector 910 terminates the process.

As illustrated in FIG. 2, the control device 900 includes a storage medium 9410. In addition to various kinds of data used by the substrate processing apparatus 1000, the storage medium 940 stores programs to cause the computer (control device 900) in the substrate processing apparatus 1000 to execute the respective steps in the above-described substrate processing method. A CPU (central processing device) in the control device 900 can read and execute the program stored in the storage medium 940. The program can be recorded in a computer-readable storage medium and provided to the control device 900 via the storage medium. Alternatively, the program may be provided to the control device 900 via a communication network, such as the Internet.

The embodiments of the present invention have been described above in order to facilitate understanding of the present invention without limiting the present invention. The present invention can be changed or improved without departing from the gist thereof, and of course, the equivalents of the present invention are included in the present invention. It is possible to arbitrarily combine or omit respective components according to claims and description in a range in which at least a part of the above-described problems can be solved, or a range in which at least a part of the effects can be exhibited. For example, while the description has been given with the example of the slip out detection of the substrate WF having the quadrilateral shape in this embodiment, the present invention is not limited to this. The present invention is also applicable to slip out detection of a substrate having another polygonal shape or a substrate having a circular shape, such as a semiconductor wafer.

This application discloses, as one embodiment, a substrate processing apparatus that includes a polishing table, a polishing head, a retainer member, a retainer member pressurization chamber, an arm, and a slip out detector. A polishing pad for polishing a substrate is attachable to the polishing table. The polishing head is for holding and pressing the substrate against the polishing pad. The retainer member is disposed surrounding the polishing head. The retainer member pressurization chamber is disposed adjacent to the retainer member. The arm is for holding and turning the polishing head. The slip out detector is for detecting a slipout of the substrate from the polishing head based on a turning torque of the arm or based on a flow rate of a fluid supplied to the retainer member pressurization chamber.

Additionally, this application discloses, as one embodiment, the substrate processing apparatus that further includes an arm torque detector for detecting a physical quantity correlated to the turning torque of the arm. The slip out detector is configured to detect the slipout of the substrate from the polishing head based on a change in the physical quantity detected by the arm torque detector.

Additionally, this application discloses, as one embodiment, the substrate processing apparatus in which the slip out detector is configured to detect the slipout of the substrate from the polishing head when an amount of change per unit time of the physical quantity detected by the arm torque detector exceeds a preset threshold value.

Additionally, this application discloses, as one embodiment, the substrate processing apparatus in which the arm torque detector is an ammeter configured to detect a drive current of an electric motor for turning the arm.

Additionally, this application discloses, as one embodiment, the substrate processing apparatus that further includes a speed detector for detecting a turning speed of the arm. The slip out detector is configured to stop the detection of the slipout of the substrate from the polishing head based on the speed detected by the speed detector.

Additionally, this application discloses, as one embodiment, the substrate processing apparatus in which the slip out detector is configured to stop the detection of the slipout of the substrate from the polishing head when the speed detected by the speed detector is less than a preset threshold value.

Additionally, this application discloses, as one embodiment, the substrate processing apparatus that further includes a supply source for supplying a fluid to the retainer member pressurization chamber and a flow rate detector for detecting the flow rate of the fluid supplied to the retainer member pressurization chamber. The slip out detector is configured to detect the slipout of the substrate from the polishing head based on a change in the flow rate detected by the flow rate detector.

Additionally, this application discloses, as one embodiment, the substrate processing apparatus in which the slip out detector is configured to detect the slipout of the substrate from the polishing head when an amount of change per unit time of the flow rate of the fluid detected by the flow rate detector exceeds a preset threshold value.

Additionally, this application discloses, as one embodiment, the substrate processing apparatus that further includes a setting change detector configured to detect an issuance of a setting change command to change at least one setting value of a height of the polishing head with respect to the polishing pad, pressures of a plurality of substrate pressurization chambers formed in the polishing head, a pressure of the retainer member pressurization chamber, a rotational speed of the polishing table, a rotational speed of the polishing head, or a turning speed of the arm. The slip out detector is configured to stop the detection of the slipout of the substrate from the polishing head for a predetermined period when the setting change detector detects the issuance of the setting change command.

Additionally, this application discloses, as one embodiment, the substrate processing apparatus that further includes a table torque detector for detecting a physical quantity correlated to a rotating torque of the polishing table. The slip out detector is configured to detect the slipout of the substrate from the polishing head based on a change in the physical quantity detected by the table torque detector.

Additionally, this application discloses, as one embodiment, the substrate processing apparatus that further includes a polishing head torque detector for detecting a physical quantity correlated to a rotating torque of the polishing head. The slip out detector is configured to detect the slipout of the substrate from the polishing head based on a change in the physical quantity detected by the polishing head torque detector.

Additionally, this application discloses, as one embodiment, the substrate processing apparatus that further includes a light emitting member for emitting a light to the polishing pad and a light receiving member for receiving a light reflected by the polishing pad. The slip out detector is configured to detect the slipout of the substrate from the polishing head based on a change in light amount or color of a reflected light received by the light receiving member.

Additionally, this application discloses, as one embodiment, a substrate processing method that includes a polishing step of holding a substrate using a polishing head and pressing the substrate against a polishing pad attached to a polishing table, and a slip out detection step of detecting a slipout of the substrate from the polishing head based on a turning torque of an arm for turning the polishing head or based on a flow rate of a fluid supplied to a retainer member pressurization chamber disposed adjacent to a retainer member disposed surrounding the polishing head.

Additionally, this application discloses, as one embodiment, the substrate processing method in which the slip out detection step detects the slipout of the substrate from the polishing head when an amount of change per unit time of a physical quantity correlated to the turning torque of the arm exceeds a preset threshold value.

Additionally, this application discloses, as one embodiment, the substrate processing method in which the slip out detection step stops the detection of the slipout of the substrate from the polishing head when a turning speed of the arm is less than a preset threshold value.

Additionally, this application discloses, as one embodiment, the substrate processing method in which the slip out detection step detects the slipout of the substrate from the polishing head when an amount of change per unit time of the flow rate of the fluid supplied to the retainer member pressurization chamber exceeds a preset threshold value.

Additionally, this application discloses, as one embodiment, the substrate processing method in which the slip out detection step stops the slip out detection for a predetermined period when a setting change command to change at least one setting value of a height of the polishing head with respect to the polishing pad, pressures of a plurality of substrate pressurization chambers formed in the polishing head, a pressure of the retainer member pressurization chamber, a rotational speed of the polishing table, a rotational speed of the polishing head, or a turning speed of the arm is issued.

Additionally, this application discloses, as one embodiment, the substrate processing method in which the slip out detection step detects the slipout of the substrate from the polishing head based on a change in a physical quantity correlated to a rotating torque of the polishing table or a change in a physical quantity correlated to a rotating torque of the polishing head.

Additionally, this application discloses, as one embodiment, the substrate processing method in which the slip out detection step detects the slipout of the substrate from the polishing head based on a change in light amount or color of a reflected light of light emitted to the polishing pad.

Additionally, this application discloses, as one embodiment, a storage medium that stores a program to cause a computer in a substrate processing apparatus to execute a substrate processing method including a polishing step of holding a substrate using a polishing head and pressing the substrate against a polishing pad attached to a polishing table, and a slip out detection step of detecting a slipout of the substrate from the polishing head based on a turning torque of an arm for turning the polishing head or based on a flow rate of a fluid supplied to a retainer member pressurization chamber disposed adjacent to a retainer member disposed surrounding the polishing head.

REFERENCE SIGNS LIST

3 . . . retainer member
10 . . . retainer member pressurization chamber
30 . . . fluid supply source
300 . . . polishing unit
302 . . . polishing head
304 . . . polishing head rotation motor
304' . . . polishing head ammeter
350 . . . polishing table
352 . . . polishing pad
359 . . . polishing table rotation motor
359' . . . polishing table ammeter
360 . . . arm
364 . . . arm rotation motor
364' . . . arm ammeter 370 . . . light emitting member
372 . . . light receiving member
900 . . . control device
910 . . . slip out detector
920 . . . speed detector
930 . . . setting change detector
940 . . . storage medium
1000 . . . substrate processing apparatus
F1 F2, F3, F4, F5, F6 . . . flow rate sensor
P1, P2, P3, P4, P5, P6 . . . pressure sensor
WF . . . substrate

What is claimed is:

1. A substrate processing apparatus comprising:
a polishing table to which a polishing pad for polishing a substrate is attachable;
a polishing head for holding and pressing the substrate against the polishing pad;
a retainer member disposed surrounding the polishing head;
a retainer member pressurization chamber disposed adjacent to the retainer member;
an arm for holding and turning the polishing head;
a slip out detector for detecting a slipout of the substrate from the polishing head based on a turning torque of the arm, and
a speed detector for detecting a turning speed of the arm,
wherein the slip out detector is configured to stop the detection of the slipout of the substrate from the polishing head based on the speed detected by the speed detector.

2. The substrate processing apparatus according to claim 1, further comprising
an arm torque detector for detecting a physical quantity correlated to the turning torque of the arm, wherein
the slip out detector is configured to detect the slipout of the substrate from the polishing head based on a change in the physical quantity detected by the arm torque detector.

3. The substrate processing apparatus according to claim 2, wherein
the slip out detector is configured to detect the slipout of the substrate from the polishing head when an amount of change per unit time of the physical quantity detected by the arm torque detector exceeds a preset threshold value.

4. The substrate processing apparatus according to claim 2, wherein
the arm torque detector is an ammeter configured to detect a drive current of an electric motor for turning the arm.

5. The substrate processing apparatus according to claim 1, wherein
the slip out detector is configured to stop the detection of the slipout of the substrate from the polishing head when the speed detected by the speed detector is less than a preset threshold value.

6. The substrate processing apparatus according to claim 1, further comprising
a setting change detector configured to detect an issuance of a setting change command to change at least one setting value of a height of the polishing head with respect to the polishing pad, pressures of a plurality of substrate pressurization chambers formed in the polishing head, a pressure of the retainer member pressurization chamber, a rotational speed of the polishing table, a rotational speed of the polishing head, or a turning speed of the arm, wherein
the slip out detector is configured to stop the detection of the slipout of the substrate from the polishing head for a predetermined period when the setting change detector detects the issuance of the setting change command.

7. The substrate processing apparatus according to claim 1, further comprising
a table torque detector for detecting a physical quantity correlated to a rotating torque of the polishing table, wherein
the slip out detector is configured to detect the slipout of the substrate from the polishing head based on a change in the physical quantity detected by the table torque detector.

8. The substrate processing apparatus according to claim 1, further comprising
a polishing head torque detector for detecting a physical quantity correlated to a rotating torque of the polishing head, wherein
the slip out detector is configured to detect the slipout of the substrate from the polishing head based on a change in the physical quantity detected by the polishing head torque detector.

9. The substrate processing apparatus according to claim 1, further comprising
a light emitting member for emitting a light to the polishing pad and a light receiving member for receiving a light reflected by the polishing pad, wherein
the slip out detector is configured to detect the slipout of the substrate from the polishing head based on a change in light amount or color of a reflected light received by the light receiving member.

10. A substrate processing method comprising:
a polishing step of holding a substrate using a polishing head and pressing the substrate against a polishing pad attached to a polishing table; and
a slip out detection step of detecting a slipout of the substrate from the polishing head based on a turning torque of an arm for turning the polishing head, wherein the slip out detection step stops the detection of the slipout of the substrate from the polishing head when a turning speed of the arm is less than a preset threshold value.

11. The substrate processing method according to claim 10, wherein
the slip out detection step detects the slipout of the substrate from the polishing head when an amount of change per unit time of a physical quantity correlated to the turning torque of the arm exceeds a preset threshold value.

12. The substrate processing method according to claim 10, wherein
the slip out detection step stops the slip out detection for a predetermined period when a setting change command to change at least one setting value of a height of the polishing head with respect to the polishing pad, pressures of a plurality of substrate pressurization chambers formed in the polishing head, a pressure of the retainer member pressurization chamber, a rotational speed of the polishing table, a rotational speed of the polishing head, or a turning speed of the arm is issued.

13. The substrate processing method according to claim 10, wherein
the slip out detection step detects the slipout of the substrate from the polishing head based on a change in a physical quantity correlated to a rotating torque of the polishing table or a change in a physical quantity correlated to a rotating torque of the polishing head.

14. The substrate processing method according to claim 10, wherein
the slip out detection step detects the slipout of the substrate from the polishing head based on a change in light amount or color of a reflected light of light emitted to the polishing pad.

15. A non-transitory storage medium for storing a program to cause a computer in a substrate processing apparatus to execute a substrate processing method comprising:
a polishing step of holding a substrate using a polishing head and pressing the substrate against a polishing pad attached to a polishing table; and
a slip out detection step of detecting a slipout of the substrate from the polishing head based on a turning torque of an arm for turning the polishing head or based on a flow rate of a fluid supplied to a retainer member pressurization chamber disposed adjacent to a retainer member disposed surrounding the polishing head, wherein the slip out detection step stops the detection of the slipout of the substrate from the polishing head when a turning speed of the arm is less than a preset threshold value.

* * * * *